United States Patent [19]

Ireland

[11] Patent Number: 4,724,402
[45] Date of Patent: Feb. 9, 1988

[54] PHASE-LOCKED LOOP APPARATUS USING AN EMBEDDED OSCILLATOR AS A LOCK DETECTION MEANS

[75] Inventor: Karl A. Ireland, Plano, Tex.

[73] Assignee: Rockwell International Corporation, El Segundo, Calif.

[21] Appl. No.: 41,892

[22] Filed: Apr. 23, 1987

[51] Int. Cl.⁴ .............................................. H03L 7/12
[52] U.S. Cl. .................... 331/4; 331/DIG. 2; 331/25; 331/141
[58] Field of Search ................ 331/4, DIG. 2, 25, 141

[56] References Cited

U.S. PATENT DOCUMENTS

| | | | |
|---|---|---|---|
| 4,009,448 | 2/1977 | Hopwood et al. | 331/4 |
| 4,246,546 | 1/1981 | McDonald | 331/4 |
| 4,535,459 | 8/1985 | Hogge, Jr. | 331/1 A X |

Primary Examiner—Siegfried H. Grimm
Attorney, Agent, or Firm—Bruce C. Lutz; V. L. Sewell; H. Fredrick Hamann

[57] ABSTRACT

An embedded circuit is placed in a phase-locked loop having the normal phase detector and voltage-controlled oscillator. The embedded circuit is transparent to phase-locked conditions of the loop and becomes operative in an oscillatory mode only when the loop loses its lock. An oscillatory detector is used to detect the oscillatory condition of the embedded circuit and causes the application of a sweep signal to the voltage-controlled oscillator to reestablish phase-locked conditions in the overall phase-locked apparatus.

6 Claims, 1 Drawing Figure

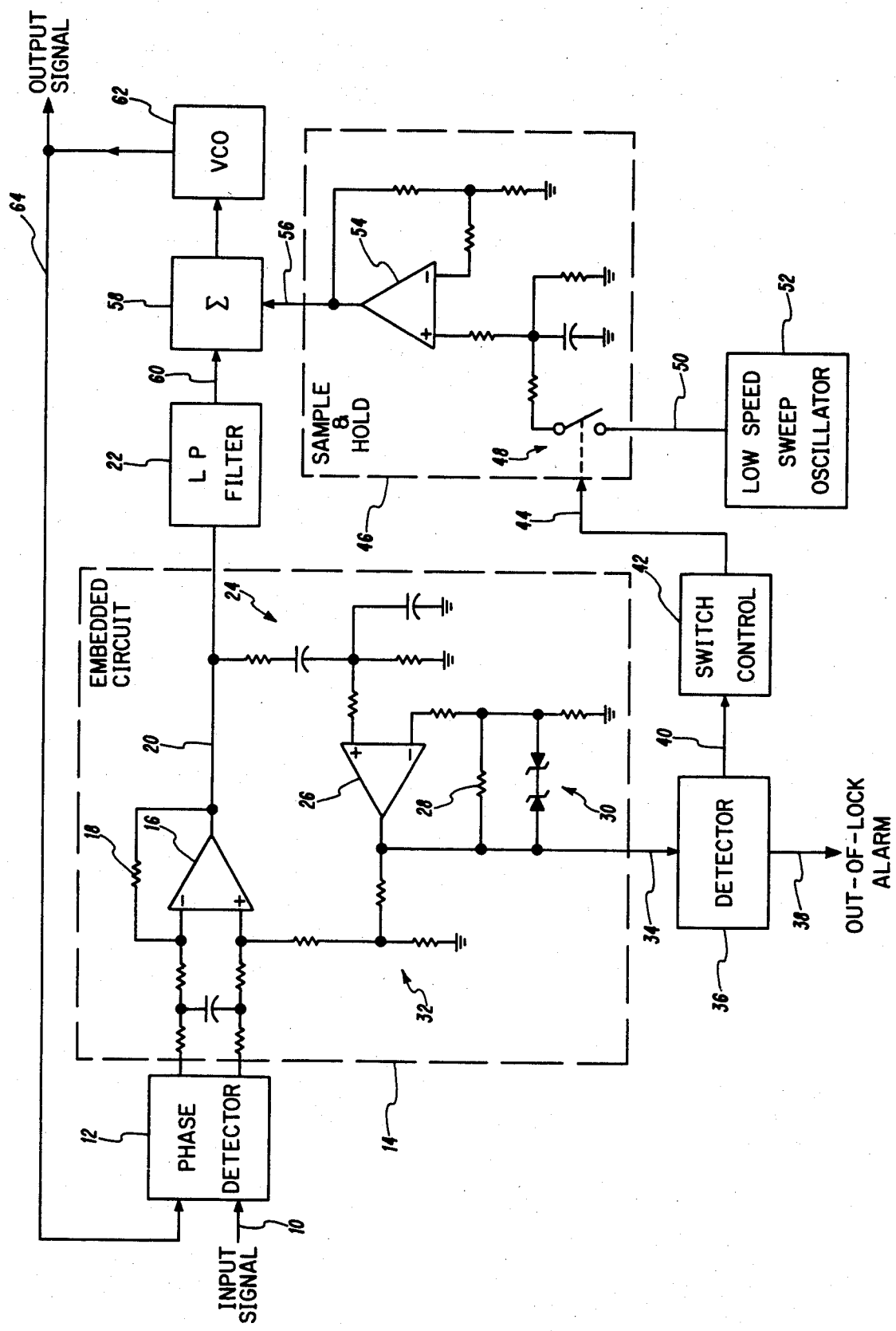

PHASE-LOCKED LOOP APPARATUS USING AN EMBEDDED OSCILLATOR AS A LOCK DETECTION MEANS

THE INVENTION

The present invention is generally concerned with electronics, and more specifically concerned with phase-locked loops. Even more specifically, the invention is concerned with a method of decreasing the time necessary for a phase-locked loop to reestablish phase-lock conditions after the circuit loses lock. The technique is especially applicable in situations where the signal being locked to is a non-return-to-zero (NRZ) signal.

BACKGROUND

Phase-locked loops have been used for many years. They are often used in clock recovery circuits in the receivers of digital systems for the purpose of synchronizing the local clock with the incoming data signal. The data signal is processed so as to provide synchronizing information to a phase detector which is an element of the phase-locked loop. Detection apparatus of the type shown in U.S. Pat. No. 4,535,459, assigned to the same assignee as the present invention may be used for the combined purposes of clock recovery and data detection. The above apparatus combines the functions of data processing and phase detection into a single circuit but, for the purpose of discussion, those functions may be thought of as separate functions. The phase detection function works as well or better than other phase detectors but it is not a phase/frequency detector and, therefore, it requires that the frequency and phase of the local clock (VCO) be within the lock range of the phase-locked loop in order for phase lock (synchronization) to be acquired. A phase-locked loop of this type therefore requires some means of determining when the loop is out of lock so some means can be used to assist the local clock (VCO) to be brought quickly to within the lock range of the loop.

Prior art phase-locked loops have utilized an embedded oscillator circuit in series between the phase detector and the voltage-controlled oscillator of a phase-locked loop where the embedded circuit is transparent to normal phase lock operation and where the embedded circuit commences oscillating when the loop looses lock and at this time attempts to drive the voltage-controlled oscillator back to an operational frequency such that lock can again occur. Such an approach has been practiced using a Wien-bridge oscillator. A unique feature of the Wien-bridge oscillator which permitted such an operation was that if its gain was less than three, the oscillations would die out. When a phase-locked loop is in the locked condition, the gain of any circuits within the loop is reduced so that in the locked condition the oscillator is not oscillating. Thus, this circuit provides a desirable function. The negative or undesirable part of this approach is that the Wien bridge oscillator has a sine wave output only if the amplifier's gain is exactly three. As the gain exceeds three, the amplifier goes rapidly towards a square wave output. Thus, there are severe production problems in maintaining a gain of three. Temperature and aging problems also contribute to the unusability of the circuit for many applications. Further, the resulting waveform, which is used to sweep the VCO, has a high slew rate as it crosses zero. This can cause the VCO to enter, pass through, and leave the locked range in less than the lockup time of the phase-locked loop.

If the oscillator time constants are set for a frequency of more than a few hertz it will introduce peaking in the response of the phase-locked loop and such peaking may exceed customer defined specifications for situations where the present invention is to be used in series with other circuits having similar transfer functions.

The present invention is designed to eliminate these problems by preventing the oscillating signal generated by the embedded circuit from reaching the VCO, and instead using an oscillation detector to detect a voltage generated within the embedded circuit when the embedded circuit is oscillating. An output is provided from the detector to a switch circuit that controls whether or not a sweep signal is supplied to the voltage-controlled oscillator.

It is therefore an object of the present invention to provide an improved lock reacquisition circuit in a phase-locked loop.

Other objects and advantages of the present invention will be apparent from a reading of the specification and appended claims in conjunction with the single drawing which is a block schematic diagram of one embodiment of the inventive concept.

DETAILED DESCRIPTION

In the drawing an input signal is supplied on a lead 10 to a phase detector 12 which provides outputs to a dash line block 14 entitled EMBEDDED CIRCUIT. Within the embedded circuit 14 there is a first amplifier 16 with a feedback resistor 18, receiving signals from phase detector 12 through a set of resistors and a capacitor. An output of amplifier 16 is supplied on a lead 20 to a low-pass filter block 22. The signals on lead 20 are also supplied through an integrating/differentiating or lead lag circuit generally designated as 24 to a non-inverting input of a second amplifier 26. A feedback resistor 28 is shown from an output to an inverting input of amplifier 26. The resistor 28 is paralleled by a pair of back-to-back Zener diodes generally indicated as 30. An output of amplifier 26 is applied to an attenuator circuit generally designated as 32, which returns signals to a non-inverting input of amplifier 16. The output of amplifier 26 is also connected via a lead 34 to a voltage, frequency or oscillation detector block 36 which provides an out-of-lock alarm signal on lead 38 and a further signal on a lead 40 to a switch control block 42. An output of switch control block 42 is supplied on a lead 44 to a dash line sample and hold block generally designated as 46. Within block 46 the lead 44 is altered to a mechanical representation operating a switch 48 which interrupts passage of signals received on a lead 50 from a low speed sweep oscillator block 52. Signals from switch 48 are supplied to a non-inverting input of an amplifier 54 which provides output signals on a lead 56 to a summing circuit 58. Summing circuit 58 also receives signals on a lead 60 from low-pass filter 22. An output of summing circuit 58 is supplied to a voltage-controlled oscillator (VCO) 62 which provides feedback signals on a lead 64 to a second input of phase detector 12, as well as providing an optional apparatus output signal.

The detector 36 can merely be a voltage amplitude detector which detects the amplitude of signals appearing on lead 34 relative to a reference. Signals of sufficient amplitude to trigger detector 36 only occur when embedded circuit 14 is in an oscillatory mode. The low-pass filter 22 is provided to introduce an appropriate transfer function in the phase-locked loop and incidentally acts to attenuate oscillatory signals appearing on lead 20 in the embedded circuit 14 from being passed to affect the sweep voltage of the VCO sweep signals as received from oscillator 52. Oscillator 52 will generally have a slowly sweeping signal of a triangular or sawtooth waveform as a desirable output. The design of low-pass filter 22 and the type of output from oscillator 52 will vary in accordance with specific applications of the phase-locked loop.

In the interest of energy efficiency and potential reduction of interfering signals, it may be desirable to use switch 42 to turn on the low speed sweep oscillator 52 only at the times that it is needed. However, the switch 48 or some equivalent would still be required to function as a holding circuit for a period of time after lock is initially acquired to prevent spikes, etc., from immediately "knocking" the loop out-of-lock.

OPERATION

As previously indicated, phase-locked loops are often used to recover clock frequency components from encoded data to be used in the manipulation of that data. When the encoded data is of the non-return-to-zero (NRZ) type, there can be occasions where the input to the phase detector is intermittent if there is a long string of logic 1's or logic 0's. Many of the standard industry phase detectors will not operate in such an environment.

In the present circuit, the phase detector 12 will provide an output based on the phase difference between the signals supplied on input leads 10 and 64. When there is a phase-locked condition or a substantially locked condition, a minimal or near minimal signal will be output from phase detector 12. It will be passed as a direct voltage through amplifier 16 within an embedded circuit 14 to the low-pass filter 22 and from there through summing circuit 58 to the VCO 62 to maintain or slightly vary the frequency of VCO 62 in a direction such that the output from phase detector 12 is minimized. The feedback signal supplied around this loop reduces the gain of every component of the loop. Thus, the gain of embedded circuit 14 is less than that required (a gain of 3) to maintain oscillations within this circuit. However, when there is no longer synchronization between the input signal and the VCO 62, the effect is the same as opening the lead 64 and eliminating feedback. At this time the gain of all the individual components, including phase detector 12 and VCO 62, is raised along with embedded circuit 14. The gain of the embedded circuit rises to three or greater and the circuit commences oscillating. As designed, the gain of amplifier 16 is reasonably close to two, and the net gain of amplifier 26 and attenuator 32 is slightly above one, so that the total gain is a gain slightly above three when there is no feedback. When there is feedback, the gain of amplifier 16 is low enough so that the total gain of the embedded circuit is below three and it will not oscillate. When the phase-lock loop loses lock and the gain of the individual components returns to normal, the oscillations of the circuit within dash line block 14 cause a voltage to appear at the output of amplifier 26 which is symmetrically limited in amplitude by the diodes 30, and creates a voltage which is detected by detector 36. Such diode limiting was needed in the embodiment first reduced to practice due to less than optimum power supply design. Detector 36 sends a signal to an appropriate switch control block, such as 42, which operates switch 48. By the appropriate choice of gain in 26, and the attenuation factor of circuit 32 in the embedded circuit 14, and the attenuation of the oscillatory signals on lead 20 as passed through the low-pass filter 22, the amplitude of the oscillatory signals from embedded circuit 14 at lead 60 is very small compared with the amplitude of the signals from sweep generator 52 at lead 56. The VCO 62 is changed in frequency and phase until it is synchronized with the signal input on lead 10 and is of a phase difference such that lock is acquired. This operation will be apparent from a reading of the referenced patent to Charles R. Hogge, Jr. When this condition occurs, the gain of the embedded circuit 14 is again reduced and the oscillations cease thereby removing the sweep signal originating from sweep oscillator 52 from being applied to VCO 62 by the opening of switch 48. The leaky sample and hold 46 maintains a control voltage for a time sufficient for the locked circuit to build up a control signal of its own to continue the locked condition after the input from block 46 fades away.

Although the controlled oscillator 62 is labeled as a VCO, it can be any controlled oscillation type device using as the control voltage, current, charge, energy, etc. Further, while the embedded circuit 14 is shown illustrated as a Wien bridge oscillator type embedded circuit, it can be any device which is typically transparent to phase-locked loop operation when the loop is locked, and which calls attention to an unlocked condition by commencing oscillations for detection by a detector such as 36.

The embedded oscillatory type circuit was described above as transparent. It should be realized that the amplifier 16 within block 14 serves two functions. One function is to combine the two outputs from phase detector 12 and supply a gain of 2 to the signals before passing the signals to the low-pass filter 22. The other function is to provide part of the oscillatory type circuit. While the signal combining and gain function is certainly not transparent to the phase lock loop in either its locked or unlocked condition, the function that it serves as an oscillatory device is considered to be transparent to the phase lock loop in its phase locked condition.

It should be noted that the embedded circuit is designed to run at a relatively high speed, and its oscillations are quickly extinguished following the lock acquisition. If the holding circuit designed as a part of amplifier 54 within sample and hold circuit 46 is not provided, transients occurring at the moment of lock, and shortly thereafter, could knock the loop out-of-lock and start the acquisition process all over again. Thus, the holding of the voltage most recently obtained from sweep oscillator 52 long enough to allow the loop to stabilize is a major attribute of this holding circuit.

I, therefore, wish to be limited not by the specific embodiment illustrated, but only by the scope of the appended claims, wherein I claim:

1. Phase lock loop out-of-lock detection apparatus comprising, in combination:
    phase lock loop means, including phase detector means having signal input means and including controllable oscillator means having control signal input means, connected in a serial looped arrangement whereby said oscillator means may lock to and follow the frequency of a signal applied to said signal input means of said phase detector means;

oscillatory type circuit means, a portion of said oscillatory type circuit means being connected serially between said phase detector means and said controllable oscillator means, said oscillatory type circuit means normally being transparent to phase lock loop operations and operating in an oscillatory mode only when said controllable oscillator means is not locked to the signal supplied to said signal input means;

detector means, connected to said oscillatory type circuit means, for providing an output signal indicating out-of-lock conditions upon detection of oscillations of said oscillatory type circuit means; and sweep oscillator means, connected between said detector means and said control signal input means of said controllable oscillator means, for supplying a sweep signal to said controllable oscillator means only while receiving said out-of-lock signal from said detector means.

2. The method of detecting out-of-lock conditions relative an input signal in a phase lock loop having a frequency controllable oscillator and a phase detector and reestablishing lock conditions comprising the steps of:

incorporating excitable circuit means in the phase lock loop which is transparent to normal signal locked operations but which oscillates at a predetermined frequency only while the phase lock loop is not locked to the input signal;

detecting when said excitable circuit means is oscillating at said predetermined frequency and providing an out-of-lock signal in accordance therewith; and supplying a sweep signal to said controllable oscillator to sweep vary the frequency of operation of said controllable oscillator only while the out-of-lock signal occurs.

3. Phase lock loop apparatus comprising, in combination:

first means for supplying a NRZ (non-return-to-zero) signal from which it is desired to recover the clock frequency;

phase detector second means, connected at a first input means to said first means for receiving said NRZ signal, and including a second input means and an output means;

controllable frequency oscillator third means, including first and second input means and output means, the frequency of operation of said third means being in accordance with the amplitude of signals supplied at either of said first and second input means thereof;

connecting fourth means connecting said output means of said third means to said second input means of said second means;

embedded oscillator fifth means, connecting said output means of said second means to said first input means of said third means, said fifth means operating in an oscillatory mode only when the phase lock loop apparatus is not in a locked condition thereby allowing the gain of said fifth means to rise;

oscillation detector sixth means, including input means and output means, connected to said fifth means for providing an out-of-lock signal when said fifth means is in an oscillatory mode; and sweep oscillator seventh means, connected between said sixth means and said second input means of said third means, for supplying sweep signals to said third means while receiving said out-of-lock signal.

4. The method of reestablishing phase lock in a phase lock loop containing an embedded circuit which is normally operationally transparent and not oscillating in the phase locked mode and further containing a voltage controlled oscillator designed to normally operate at the data bit frequency of an input signal comprising the steps of:

detecting whether or not the embedded circuit is oscillating and generating an out-of-lock signal upon detection of oscillation; and activating the application of a sweep signal to said voltage controlled oscillator upon generation of said out-of-lock signal.

5. Apparatus for reestablishing phase lock in a phase lock loop comprising, in combination:

phase lock loop first means including phase sensor second means, an embedded circuit third means which is normally operationally transparent and not oscillating in the phase locked mode and voltage controllable oscillator fourth means designed to normally operate at the data bit frequency of an input signal;

detection fifth means, connected to said third means, for detecting whether or not the embedded circuit is oscillating and generating an out-of-lock signal upon detection of oscillation at an output means thereof; and sweep signal sixth means, connected to said fifth and said fourth means, for applying a sweep signal to said oscillator fourth means upon receipt of said out-of-lock signal.

6. Phase lock loop apparatus comprising, in combination:

first means for supplying an input first signal from which it is desired to recover the clock frequency;

phase detector second means, connected at a first input means to said first means for receiving said input first signal, and including a second input means and an output means;

controllable frequency oscillator third means, including first and second input means and output means, the frequency of operation of said third means being in accordance with the amplitude of signals supplied at either of said first and second input means thereof;

connecting fourth means connecting said output means of said third means to said second input means of said second means;

embedded oscillator fifth means, connecting said output means of said second means to said first input means of said third means, said fifth means operating in an oscillatory mode only when the phase lock loop apparatus is not in a locked condition thereby allowing the gain of said fifth means to rise;

oscillation detector sixth means, including input means and output means, connected to said fifth means for providing an out-of-lock signal when said fifth means is in an oscillatory mode; and sweep oscillator seventh means, connected between said sixth means and said second input means of said third means, for supplying sweep signals to said third means while receiving said out-of-lock signal.

* * * * *